United States Patent [19]

Hedberg

[11] Patent Number: 5,396,523
[45] Date of Patent: Mar. 7, 1995

[54] SHIFTING THE PHASE OF A CLOCK SIGNAL, IN PARTICULAR FOR CLOCK RECOVERY OF A DIGITAL DATA SIGNAL

[75] Inventor: Mats O. J. Hedberg, Haninge, Sweden

[73] Assignee: Telefonaktiebolaget L M Ericsson, Stockholm, Sweden

[21] Appl. No.: 991,169

[22] Filed: Dec. 16, 1992

[30] Foreign Application Priority Data

Dec. 23, 1991 [SE] Sweden .................. 9103833

[51] Int. Cl.⁶ .................. H03D 3/24; H03K 5/00; H03K 5/159; H03K 5/13
[52] U.S. Cl. .................. 375/373; 327/298; 327/113; 327/237
[58] Field of Search .................. 328/55, 63, 133, 155, 328/160; 307/262, 269; 375/118, 119, 111

[56] References Cited

U.S. PATENT DOCUMENTS 3,621,406 11/1971 Paine et al. .
4,218,771 8/1980 Hogge, Jr. .
4,423,382 12/1983 Becker .................. 328/55
4,808,936 2/1989 Lamb .
4,829,257 5/1989 Cooper .
4,955,040 9/1990 Sarkoezi .

FOREIGN PATENT DOCUMENTS 60-251740 12/1985 Japan .
61-49536 3/1986 Japan .

Primary Examiner—Stephen Chin
Assistant Examiner—Duane Kobayashi
Attorney, Agent, or Firm—Burns, Doane, Swecker & Mathis

[57] ABSTRACT

The invention relates to a clock recovery for a digital data signal. A phase detector receives the data signal and transmits it after clock recovery. A phase correcting device creates and transmits, by means of a number of auxiliary clock signals phase shifted with respect to each other and originating from an incoming clock signal ($CK_{in}$), a recovered clock signal ($CK_{out}$) for the data signal. The recovered clock signal is fed to the phase detector, which detects a phase position error, if any, between the data signal and its recovered clock signal and emits information regarding this to the phase correcting device. The phase correcting device includes a phase variation circuit arranged, if the phase position error deviates from zero and the phase position of the recovered clock signal is located between the phase positions of two of the auxiliary clock signals, to mix these two auxiliary clock signals with each other for forming an adjusted recovered clock signal with the same phase position as the data signal. The invention allows shifting of the phase of a clock signal continuously an arbitrary number of turns forwards or backwards without interruptions or discontinuities in the recovered clock signal. This implies that the invention can also be applied in the case of a difference occurring between the bit frequency of incoming data and the clock reference frequency.

59 Claims, 8 Drawing Sheets

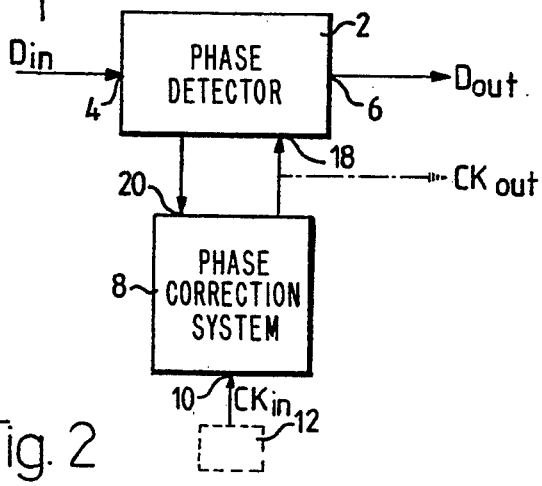
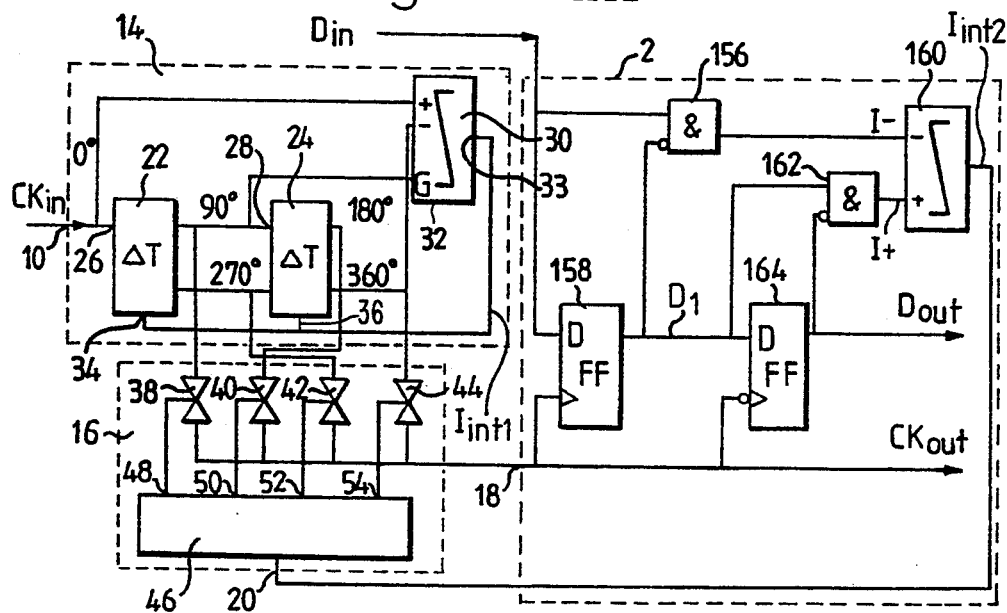
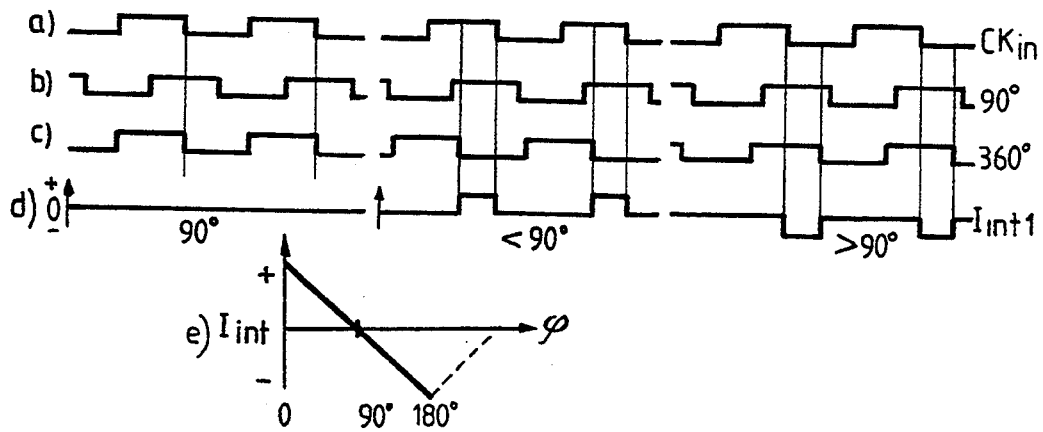

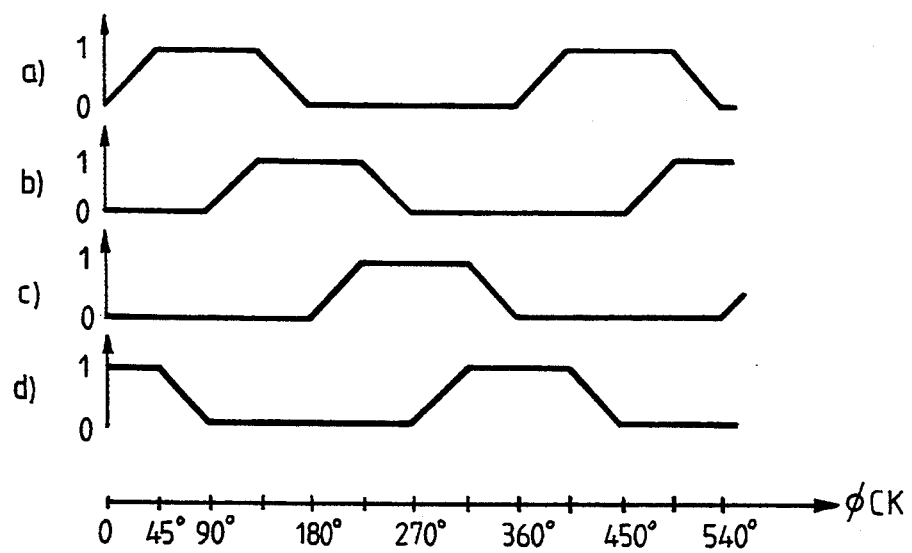
Fig. 7
Fig. 10A  Fig. 10B  Fig. 10C
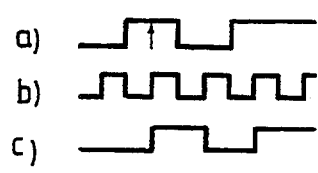 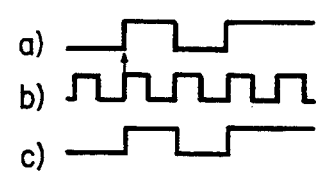 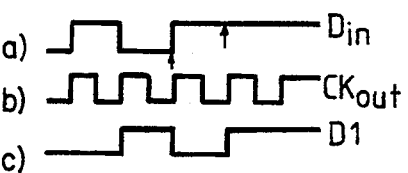
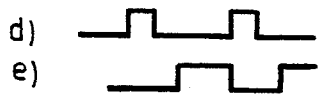 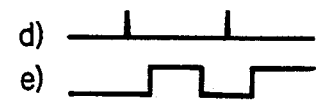 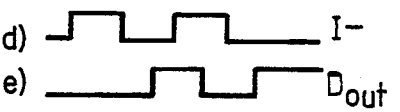
 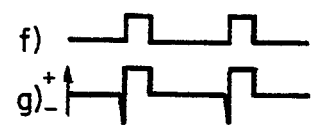 
correct clock    early clock    late clock correct clock    early clock    late clock

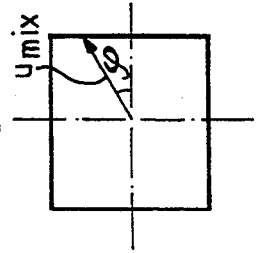
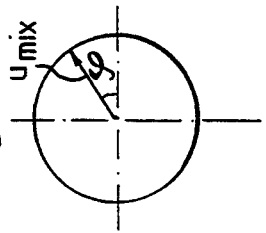
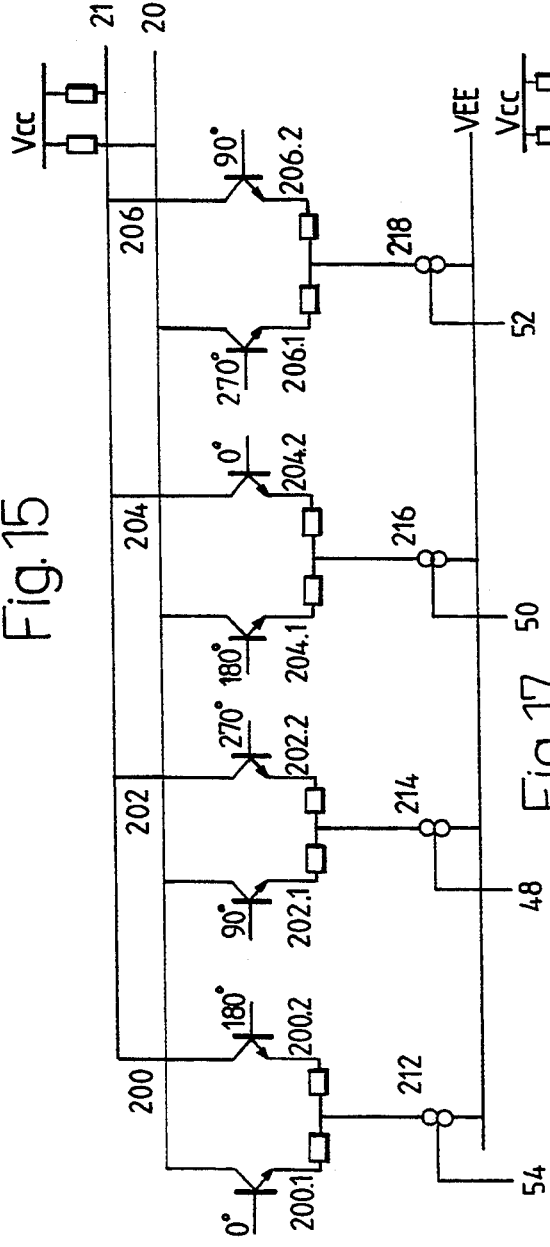
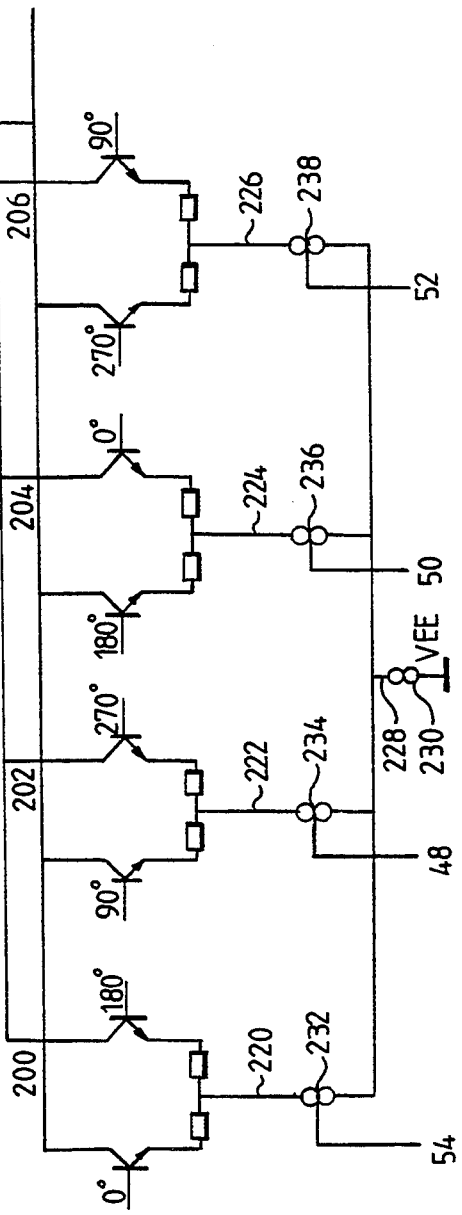

SHIFTING THE PHASE OF A CLOCK SIGNAL, IN PARTICULAR FOR CLOCK RECOVERY OF A DIGITAL DATA SIGNAL

TECHNICAL AREA

According to a first aspect the present invention relates more generally to a system for shifting the phase of a clock signal, including first means for receiving said clock signal and providing a number of auxiliary clock signals phase shifted with respect to said clock signal and to each other, second means for choosing two of the auxiliary clock signals between the phases of which a desired new phase of said clock signal is situated, and third means for mixing the two chosen auxiliary clock signals with each other until a signal with said desired phase is obtained.

According to a second aspect the invention relates to a method for clock recovery of a digital data signal, wherein a number of mutually phase shifted auxiliary clock signals are used to create a recovered clock signal for the data signal based upon the result of detection of a phase position error, if any, between the data signal and its recovered clock signal, and a system for clock recovery of a digital data signal including a phase detector for receiving the data signal and transmitting the same after clock recovery, a phase correcting device for creating and emitting, by means of a number of mutually phase shifted auxiliary signals derived from an incoming clock signal, a recovered clock signal for the data signal, said recovered clock signal being fed to the phase detector for detecting a phase position error, if any, between the data signal and its recovered clock signal and to transmit information with respect to this to the phase correcting device.

STATE OF THE ART

Among conventional methods for providing clock recovery can be mentioned the use of so called SAW filters, or a voltage or current controlled oscillator. These solutions have the following disadvantages.

SAW filters are relatively expensive, space consuming, cannot be integrated and consume a relatively large amount of power. Furthermore, one filter is required for each input.

A controlled oscillator can certainly be integrated, except for the crystal, but requires a relatively great amount of electronic circuitry for carrying through the control, and consumes a relatively large amount of power.

Through U.S. Pat. No. 4,955,040 a digital clock recovery system is known, which includes a phase sensor for a digital data signal. The phase sensor provides information to a phase correcting device with regard to the phase position of the digital data signal and obtains therefrom a first auxiliary data clock signal being the recovered clock of the digital signal, as well as a second auxiliary data clock signal which has a defined phase difference with respect to the first one. The phase sensor compares the phase relation between the active edges of the pulses of the digital data signal and the second auxiliary data signal. If the result of the comparison is that no phase difference can be seen, a correction signal is generated which causes a phase correction of the two auxiliary data clock signals resulting in the creation of the defined phase difference.

In U.S. Pat. No. 4,218,771 a controlled phase shift circuit is described. The phase of the clock pulses is continuously optimized with respect to the received signal under the control of pseudo-error detectors.

In JP 60-251740 it is described how optimal timing of sampling is always maintained by the use of a timing synchronizing system including a variable phase circuit automatically controlling/regulating the phase of an output signal from an oscillator forming an original oscillator for a timing signal.

In JP 61-49536 a digital phase synchronizing circuit is described. The phase of the output clock signal of the circuit is corrected and its phase locking properties are improved by detection of the magnitude of the phase shift in either direction of the output clock signal based upon an input clock signal, and proportional setting of the phase correction with respect to the detected magnitude.

STATEMENT OF INVENTION

A first object of the invention is to provide a system in accordance with the first aspect, which allows simple and continuous shifting of the phase of a clock signal.

A second object of the invention is to provide a method and a system, of the kind defined by way of introduction according to the second aspect, for clock recovery of a digital data signal which can be integrated and, as compared with conventional solutions, is cheaper and less power consuming.

The system according to the first aspect, defined by way of introduction, is characterized by a number of controllable switching means having auxiliary clock signal inputs for receiving said auxiliary clock signals, and a common output on which said signal with the desired phase is obtained, a control signal generator for providing a control signal with a variable amplitude and sign, a selector circuit having a control input for receiving said control signal, control outputs connected for controlling the let through of the switch means of their respective auxiliary clock signal, and activating means for continuously following the amplitude and sign of said control signal and, guided thereby, chosing and activating a number of the control outputs.

According to one favourable embodiment said activating means include an analog control network and an analog selector, which both are connected for receiving the control signal, the control network controlling the selector for entirely opening, via one of the chosen control outputs, a corresponding switching means for letting through the corresponding auxiliary signal without amplitude decrease, and for connecting, via another chosen control output, the control signal with correct sign to a corresponding switching means for letting through the corresponding auxiliary clock signal with an amplitude decrease determined by the amplitude of the control signal.

Preferably this system comprises inverting means for inverting the control signal, an analog switch having a first input for receiving the control signal, a second input for receiving the inverted value of the control signal from said inverting means, and an output connected to the input of said analog selector, said control network controlling the choice of either of said first and second inputs of said analog switch for determination of sign of an output signal appearing on said output thereof.

According to a further favourable embodiment said controllable switching means comprise a number of differentially connected pairs of first and second controlled switches, said pairs being located between voltage source means and a common differential output having first and second terminals for forming said common output for said signal with the desired phase, said first and second controlled switches of each pair having respective outputs connected to said first and second terminals, respectively, said pairs being further connected to said voltage source means via current path means containing current source means and control means connected to said control outputs for controlling the current flow to said pairs, said controlled switches having control inputs connected for receiving said auxiliary clock signals.

Said differentially connected pairs are preferably in turn connected in pairs for receiving one of said auxiliary clock signals on the control input of the first controlled switch of one of the two differentially connected pairs forming such a last mentioned pair and on the control input of the second controlled switch of the other differentially connected pair, and another one of said auxiliary clock signals on the control input of the second controlled switch of said one pair, and on the control input of the first controlled switch of said other pair.

Furthermore said current path means may preferably comprise a respective current path for each of said differentially connected pairs, said current source means comprise a respective controllable current source in each current path, and said control means comprise respective control inputs of said controllable current sources.

Alternatively said current path means may comprise a respective first current path for each of said differentially connected pairs and a second current path common to all differentially connected pairs between said first current paths and said voltage source means, said current source means comprise a common current source in said second current path, and said control means comprise a respective controllable switching means with a respective control input in each of said first current paths.

In a further, very favourable embodiment of the system according to the first aspect said controllable switching means comprise a number of sets of at least one differentially connected pair each of first and second controlled switches, said pairs being located between voltage source means and a common differential output having first and second terminals for forming said common output for said signal with the desired phase, said first and second controlled switches of each pair having respective outputs connected to said first and second terminals, respectively, said sets of pairs being further connected to said voltage source means via a number of digitally controllable current sources having control inputs connected to logic circuitry having as an input said control signal with a variabel amplitude and sign, and said controlled switches having control inputs connected for receiving said auxiliary clock signals.

Preferably, in this embodiment, said differentially connected pairs may in turn be connected in pairs for receiving one of said auxiliary clock signals on the control input of the first controlled switch of one of the two differentially connected pairs forming such a last mentioned pair and on the control input of the second controlled switch of the other differentially connected pair, and another one of said auxiliary clock signals on the control input of the second controlled switch of said one pair, and on the control input of the first controlled switch of said other pair.

Alternatively each of said differentially connected pairs may be connected for receiving the two auxiliary clock signals of a respective pair of said auxiliary clock signals alternately on its first and second control inputs.

Each of said sets may preferably comprise a single differentially connected pair of first and second controlled switches connected via at least two of said digitally controllable current sources in parallel to said voltage source means.

Alternatively each set may comprise more than one of said differentially connected pairs of first and second controlled switches.

In accordance with the invention the method according to the second aspect is characterized in that, if the phase position error is different from zero and the phase position of the recovered clock signal is situated between the phase positions of two auxiliary clock signals, said two auxiliary clock signals are mixed with each other for forming an adjusted recovered clock signal with the same phase position as the data signal.

Preferably the mixing is carried through while adjusting the relative amplitude of the two auxiliary clock signals.

In a favourable embodiment said result of detection of the phase position error is generated in the form of an error signal with an amplitude being a measure of the amplitude of the phase position error, and a sign indicating the direction for adjusting the phase position of the recovered clock signal, said amplitude and said sign being used as control parameters for the adjustment.

Preferably said control parameters may be used for chosing the two auxiliary clock signals to be mixed, the amplitude parameter also being used for controlling a change of the amplitude of one of the auxiliary clock signals.

In accordance with the invention the system according to the second aspect is characterized in that the phase correction device includes a phase variation circuit for mixing, if the phase position error is different from zero and the phase position of the recovered clock signal is situated between the phase position for two auxiliary clock signals, these two auxiliary clock signals with each other for forming an adjusted recovered clock signal having the same phase position as the data signal.

Preferably the phase variation circuit includes a number of controllable switching means for receiving on auxiliary clock signal inputs said auxiliary clock signals and connected to a common output, on which the recovered clock signal with the shifted phase is obtained, a selector circuit with control outputs connected for controlling the let through of the switch means of their respective auxiliary clock signal, and with activating means for continuously following the magnitude and sign of the control signal and guided thereby chose and activate a number of the control outputs.

In a preferable embodiment the detector circuit creates and transmits the phase position information in the form of an analog signal the amplitude of which is a measure of the magnitude of the phase error, and the sign of which indicates the direction of the phase error, and the activating means include an analog control network and an analog selector which both are connected for receiving the analog signal, the control network controlling the selector to entirely open, via one of the two chosen control outputs, the corresponding switching means for letting through of the auxiliary clock signal thereof without amplitude decrease, and to connect, via the other chosen control output, the analog signal with correct sign to the corresponding switching means for letting through the auxiliary clock signal thereof with an amplitude decrease determined by the amplitude of the control signal.

In this connection the system may preferably comprise inverting means for inverting the control signal, an analog switch having a first input for receiving the control signal, a second input for receiving the inverted value of the control signal from said inverting means, and an output connected to the input of said analog selector, said control network controlling the choice of either of said first and second inputs of said analog switch for determination of sign of an output signal appearing on said output thereof.

According to a favourable embodiment said controllable switching means comprise a number of differentially connected pairs of first and second controlled switches, said pairs being located between voltage source means and a common differential output having first and second terminals for forming said common output for said signal with the desired phase, said first and second controlled switches of each pair having respective outputs connected to said first and second terminals, respectively, said pairs being further connected to said voltage source means via current path means containing current source means and control means connected to said control outputs for controlling the current flow to said pairs, said controlled switches having control inputs connected for receiving said auxiliary clock signals.

Said differentially connected pairs are preferably in turn connected in pairs for receiving one of said auxiliary clock signals on the control input of the first controlled switch of one of the two differentially connected pairs forming such a last mentioned pair and on the control input of the second controlled switch of the other differentially connected pair, and another one of said auxiliary clock signals on the control input of the second controlled switch of said one pair, and on the control input of the first controlled switch of said other pair.

In a further favourable embodiment said current path means comprise a respective current path for each of said differentially connected pairs, said current source means comprise a respective controllable current source in each current path, and said control means comprise respective control inputs of said controllable current sources.

Alternatively said current path means may comprise a respective first current path for each of said differentially connected pairs and a second current path common to all differentially connected pairs between said first current paths and said voltage source means, said current source means comprise a common current source in said second current path, and said control means comprise a respective controllable switching means with a respective control input in each of said first current paths.

In a further very favourable embodiment of the system according to the second aspect said controllable switching means comprise a number of sets of at least one differentially connected pair each of first and second controlled switches, said pairs being located between voltage source means and a common differential output having first and second terminals for forming said common output for said signal with the desired phase, said first and second controlled switches of each pair having respective outputs connected to said first and second terminals, respectively, said sets of pairs being further connected to said voltage source means via a number of digitally controllable current sources having control inputs connected to logic circuitry having as an input said control signal with a variabel amplitude and sign, and said controlled switches having control inputs connected for receiving said auxiliary clock signals.

Preferably said differentially connected pairs are in turn connected in pairs for receiving one of said auxiliary clock signals on the control input of the first controlled switch of one of the two differentially connected pairs forming such a last mentioned pair and on the control input of the second controlled switch of the other differentially connected pair, and another one of said auxiliary clock signals on the control input of the second controlled switch of said one pair, and on the control input of the first controlled switch of said other pair.

Alternatively each of said differentially connected pairs may be connected for receiving the two auxiliary clock signals of a respective pair of said auxiliary clock signals alternately on its first and second control inputs.

Each of said sets may preferably comprise a single differentially connected pair of first and second controlled switches connected via at least two of said digitally controllable current sources in parallel to said voltage source means.

Alternatively each set may comprise more than one of said differentially connected pairs of first and second controlled switches.

DESCRIPTION OF THE DRAWINGS

In the drawings

FIG. 1 shows a schematic block diagram of a clock recovery device according to the invention, FIG. 2 shows a more detailed block diagram of the clock recovery device according to the invention including a phase detector and a phase correction device in the form of a "clock rotator", FIGS. 3(a–e) show signal diagrams of the phase correction device according to FIG. 2 for deriving 90° phase shifted auxiliary clock signals, FIG. 15 is a schematic circuit diagram of a further embodiment of a portion of a phase variation circuit included in the phase correction device, FIG. 16 is a vector diagram illustrating variation of the amplitude of the output clock signal with phase changes in the circuit according to FIG. 15, FIG. 17 is a schematic circuit diagram illustrating a modification of the circuit according to FIG. 15, FIG. 18 is a vector diagram illustrating variation of the amplitude of the output clock signal with phase changes in the circuit according to FIG. 17.

PREFERRED EMBODIMENTS

Figure 4:
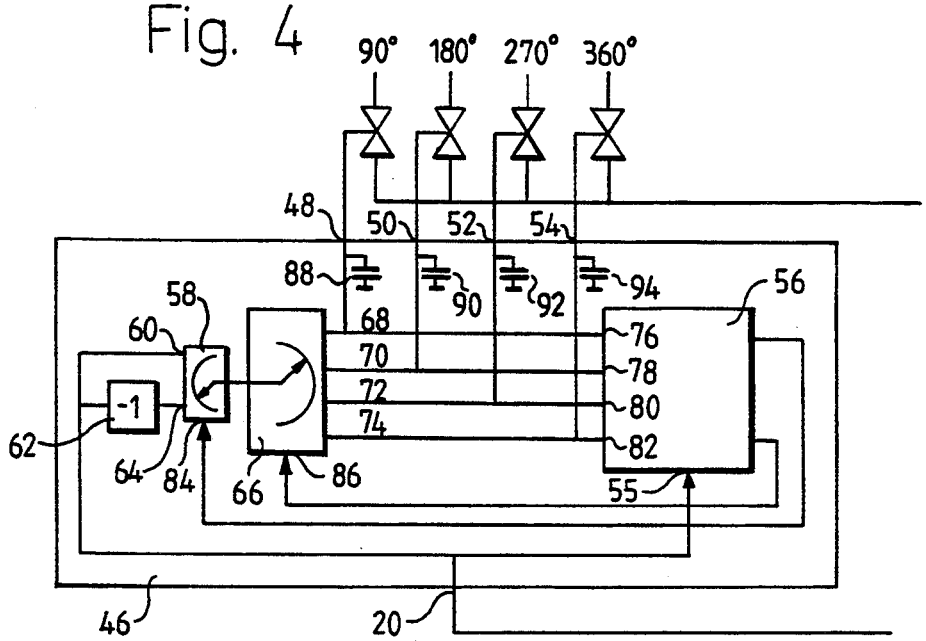
FIG. 4 shows a diagram of one embodiment of the phase correction device.

The system schematically shown in FIG. 1 for clock recovery of a digital data signal $D_{in}$ includes a phase detector 2. The phase detector 2 has an input 4 for receiving the data signal $D_{in}$ and an output 6 for emitting the same after clock recovery. A phase correction system 8 has an input 10 for receiving a reference clock signal $CK_{in}$, either from a clock 12 or in the form of an external clock signal.

Referring also to FIG. 2 the phase correction system 8 includes a circuit 14 deriving from the reference clock signal $CK_{in}$ a number of mutually phase shifted auxiliary clock signals. The phase correction system 8 is furthermore arranged for creating and emitting, in a way to be described more closely below, a recovered clock signal $CK_{out}$ for the data signal. The recovered clock signal is fed to the phase detector 2 which, in a way to be likewise described more closely below, detects a phase position error, if any, between the data signal and its recovered clock signal, and emits information with regard to this to the phase correction system 8.

The phase correction system 8 includes a phase variation circuit 16 which, if the phase position error is different from zero and the phase position of the recovered clock signal is situated between the phase positions of two of the auxiliary clock signals, mixes these two auxiliary clock signals with each other for forming an adjusted recovered clock signal with the same phase position as the data signal. This will likewise be described more closely below.

The phase variation circuit 16 is also referred to as a clock or phase rotator below.

More particularly, the recovered clock signal $CK_{out}$ is fed to an input 18 of the phase detector 2 which creates the phase position information in the form of a current signal $I_{int2}$, which is fed to a control input 20 of the circuit 16. As likewise described more closely below, this current signal is created so that its amplitude will form a measure of the magnitude of the phase position error and so that the sign thereof indicates the direction for adjusting the phase position of the recovered clock signal.

The design and function of the circuit 14 will now be described more closely with reference to FIGS. 2 and 3.

The circuit 14 includes two phase delay and differential steps 22 and 24, consisting of differential amplifiers, the speed and band width of which may be controlled by means of an external reference current generated in a way described below.

The delay step 22 on an input 26 receives the clock signal $CK_{in}$ and delays it with 90°, and emits this 90° signal and its antiphase signal, i.e. a signal phase shifted 270° with respect to the incoming clock signal $CK_{in}$, on a respective output. The 90° phase delayed signal is fed to an input 28 of the delay step 24 which in turn shifts the phase thereof further by 90°, i.e. to 180° with respect to the incoming clock signal, and emits this signal and its 360° antiphase signal on a respective output.

In FIG. 2 and further below the four thus obtained phase delayed signals are indicated with their respective phase delay values with respect to the clock signal $CK_{in}$.

The clock signal $CK_{in}$ and the 360° signal are fed to a plus and a minus input, respectively, of an integrator 30, the band width of which is so low that the output current may be regarded as a direct current. The integrator 30 has an extra gate input 32 for making the integrator active only when a positive signal is received on this input. The 90° signal is fed to the gate input 32 of the integrator. Thereby the integrator 30 is arranged to generate the above mentioned external reference signal for the delay steps 22 and 24 and emits the same on an output 33 which is fed back to respective control inputs 34 and 36 of the two delay steps 22 and 24 and thereby by means of said reference signal controls the latter so that they are set to 90° phase delay.

FIGS. 3a–d show the clock signal $CK_{in}$, the 90° signal, the 360° signal and the output signal $I_{int1}$ of the integrator 30 above each other for three different cases following each other in the horizontal direction. These are phase shift with exactly 90°, less than 90° and more than 90°, respectively, of the delay steps. The latter two cases involve, as appears from a comparison of FIG. 3a and FIG. 3c, a corresponding phase shift between the clock signal $CK_{in}$ and the 360° signal, and gives rise to positive and negative current pulses from the integrator 30 with a width corresponding to the phase shift, as appears from FIG. 3d. FIG. 3e shows the mean current $\bar{I}_{int1}$ as a function of the phase shift or angular error $\rho$ over a delay step. The output current of the integrator is thus zero at 90° phase shift.

The design and operation of the delay steps 22 and 24 designed as differential amplifiers according to the above, as well as of the integrator 30 should be evident to the ordinary man of the art and need therefore not be described more closely below.

The design and function of the phase varying circuit 16 will now be described more closely below with reference to FIGS. 2 and 4–9.

The 90°, 180°, 270° and 360° output signals derived from the delay steps 22 and 24 are fed to a respective switching element 38, 40, 42, and 44, included in the phase varying circuit 16. The switching elements 38–44 can consist of some form of controllable impedances, e.g. FET resistances or MOS transistors. The recovered clock signal $CK_{out}$ is obtained, in a way to be described more closely below, on the outputs of the switching elements 38–44, said outputs being connected in parallel to the input 18 of the phase detector 2.

The control input 20 receiving the above-mentioned current signal forms the input of an analog selector circuit 46 which, via outputs 48, 50, 52, 54, controls the let through of the respective switching elements 38, 40, 42 and 44, of their respective phase shifted signal.

An embodiment of the selector circuit 46 is shown in more detail in FIG. 4. The current signal to the selector circuit 46 is led, on the one hand, to an input 55 of a logic control network 56 to be described more closely below, which contains digital logic, and, on the other hand, to an analog switch 58 receiving the current signal on an input 60 and, via an inverting amplifier 62, its inverted value on an input 64. The switch 58 has an output connected to an analog selector 66 with four outputs 68, 70, 72, and 74 connected to each one of the respective outputs 48, 50, 52 and 54 of the selector circuit 46, and to each one of four inputs 76, 78, 80 and 82, respectively, of the logic control network 56. The latter has two outputs connected to a control input 84 of the analog switch 58 and, respectively, to a control input 86 of the analog selector 66.

The capacitances designated 88, 90, 92 and 94 in FIG. 4 of the outputs 48–54 represent parasit capacitances and extra capacitance, if any.

Figure 5:
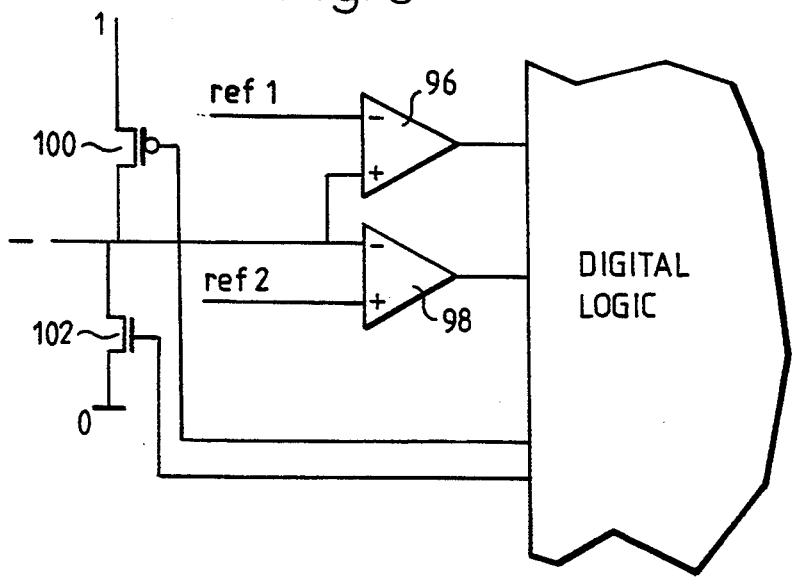
FIGS. 5 and 6 show portions of the diagram according to FIG. 4 more in detail, FIGS. 7(a–d) show diagrams illustrating control signals derived in the phase correction device for enabling continuous variation of the phase of recovered clock signal.

The design of each of the inputs 76, 78, 80, 82 appears more closely from FIG. 5. Between each input and the digital logic there are two comparators 96 and 98 arranged in parallel. The comparator 96 on its +input receives a control voltage derived in a way to be disclosed more closely below from the current signal, and on its −input a set first reference value ref1, and gives maximum output signal if said control voltage exceeds this reference value. The comparator 98 in the same way receives on its −input a control voltage derived in a way to be disclosed more closely below from the current signal and on its +input a set second reference value ref2, and gives minimum output signal if this control voltage is lower than this reference value. By means of the above described function of the two comparators 96 and 98 a detection is carried through with respect to when the outputs from the selector 66 are fully set to minimum or maximum value, as will be likewise described more closely below.

Each of the inputs 76–82 furthermore includes two schematically indicated holding functions in the form of MOS transistors 100 and 102 of n and p type, respectively, connected as shown, which are controlled by signals from the digital logic for holding the corresponding output of the selector 66 when it has such a phase position that it shall keep a fixed level 0 or 1 (FIG. 7), said levels being defined more closely below.

Figure 6:
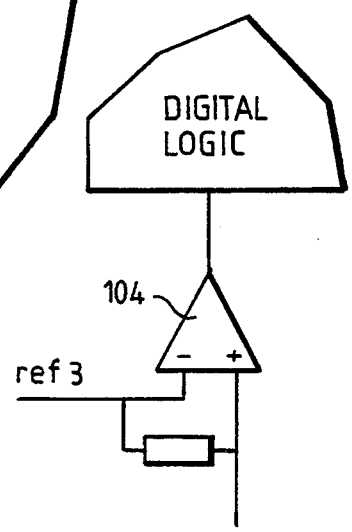

With reference to FIG. 6 the input 55 of the logic control network 56 is connected to the digital logic included therein via a comparator 104, more particularly its +input. Comparison with a reference value ref3 on the −input of the comparator is carried through for detecting whether the current signal $I_{int2}$ from the detector 2 has a positive or negativ sign. This gives a detection of whether the phase of $CK_{ut}$ precedes or lags, and enables the digital logic to change the phase in the correct direction.

The digital technique of the logic control network 56 provides for the current signal $I_{int2}$, in accordance with that which will be described more closely below, to be periodically connected to the outputs 68, 70, 72 and/or 74 in accordance with a predetermined scheme by means of the analog selector 66, and so that it becomes the correct sign by means of the analog switch 58. The current signal charges the respective capacitances 88, 90, 92 or 94, the resulting charging voltage of which being applied to the control electrode of the respective switching elements 38, 40, 42 or 44.

The scheme mentioned above is illustrated most simply by means of the diagrams of FIGS. 7a–d. These diagrams illustrate the charging voltages $u_a$, $u_b$, $u_c$, $u_d$ of the capacitances 88–94, the degree signs on the lower horizontal common axis representing the phase shift between $CK_{in}$ and $CK_{out}$. The levels 0 and 1 in the diagrams mean that the respective signal is completely disconnected or completely connected into circuit, respectively, which is obtained by means of the systems described above with reference to FIG. 5. The ramps represent charge and discharge of the respective capacitances 88–94, which enables a continuous control of the switching elements 38–44 and thereby of the phase of the recovered clock signal $CK_{out}$. More particularly, this is attained by such a design of the digital logic that its function can be described by the state graph shown in FIG. 8.

Figure 8:
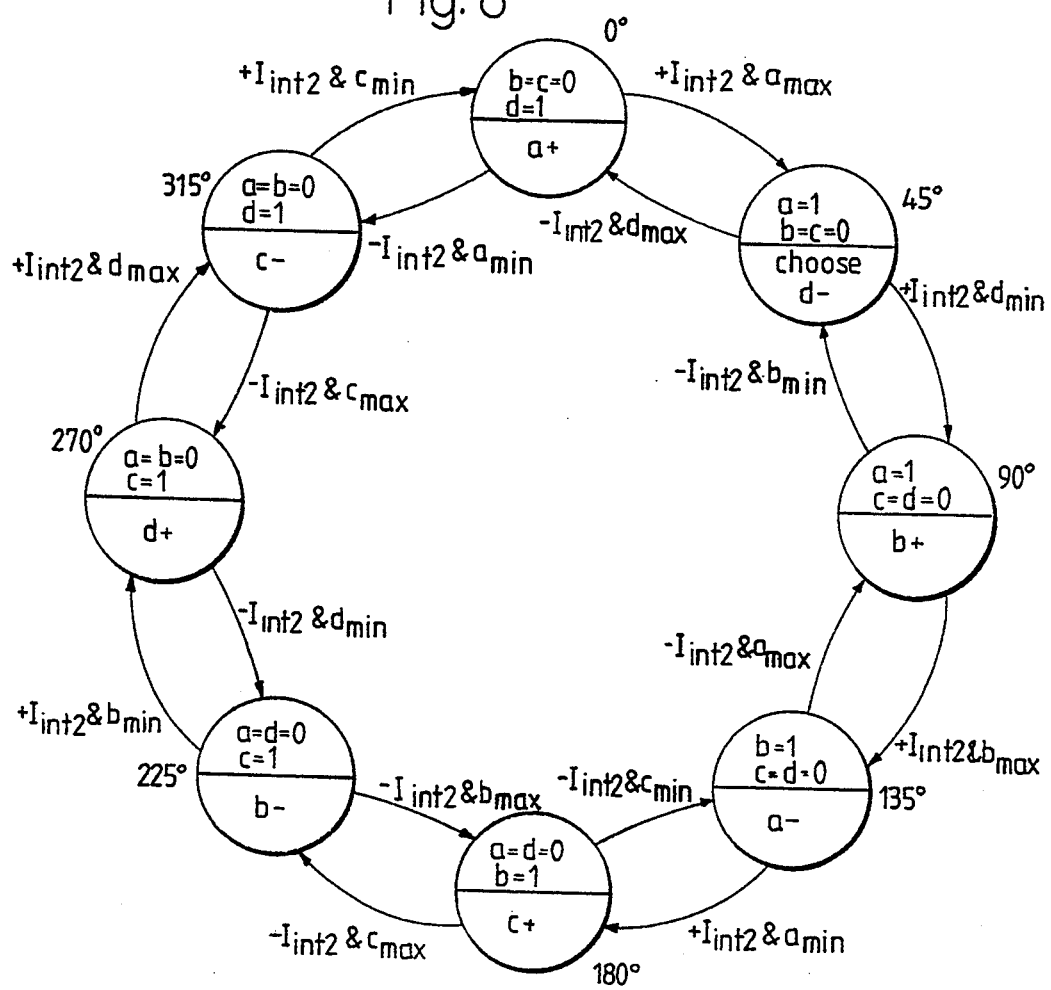
FIG. 8 is a state graph illustrating the way of operation of the phase correction device.

In the state graph according to FIG. 8 the state rings represent the successively varying states of the switching elements 38, 40, 42 and 44, the degree sign at the respective ring indicating the starting point for the state according to this ring as seen along the horizontal axis in FIG. 7, the letters a–d represent the respective diagrams a–d in FIG. 7, "=0" and "=1" in association with the letter indicating the state 0 and 1, respectively, of the respective voltage $u_a$–$u_d$, "+" or "−" in association with the letter indicating a state on the positive and negative edge, respectively, of the respective diagram, and "max" or "min" in association with the letter indicating the end of a positive or a negative edge, respectively, $+I_{int2}$ and $-I_{int2}$ represent information as to whether the sign of $I_{int2}$ is + or −, respectively.

In the ring at 0° in the state graph b=c=0, d=1 involves that the logic of the logic control network 56 via the holding functions 100 and 102 holds the inputs 78 and 80 on the fixed level 0, and the input 82 on the fixed level 1. Regarding "a+", "a" involves that the logic controls the selector 66 to keep the output 68 open, and "+" means that the switch 58, by the logic detecting the sign of $I_{int2}$ at the input 55 (FIG. 6), is controlled to keep its input 60 open, i.e. $I_{int2}$ is let through non-inverted by the selector.

As a result the switching element 44 is kept completely open for the 360°(°) signal, and the capacitance 88 is charged by the current from the output 68 so that the switching element 48 successively opens for the 90° signal. A mixing of the two mentioned signals on the common output from the switching elements is obtained, and results in the phase of the resulting signal ($CK_{out}$) successively increasing from 0° as the amplitude of the 90° signal increases. This corresponds to moving upwardly along the positive edge of the curve a in FIG. 7.

If the current $I_{int2}$ stops flowing the logic stops, and the charging of the capacitance 88 stops. On one hand, this results in the switching element 44 henceforth being kept open due to the fact that the state on the logic input 82 is kept fixed, and on the other hand, that the capacitance 88 keeps its attained charge, and its voltage maintains the attained open state of the switch element 38. $CK_{out}$ has been brought into phase with $D_{in}$.

However, if $I_{int2}$ continues to flow with a positive sign a state is attained at last where both of the switching elements 38 and 44 are completely open, which implies that the phase of $CK_{out}$ has moved halfway between 0° and 90°, i.e. 45°. The logic now via the respective comparator pair 96, 98 (FIGS. 4,5) senses that its inputs 76 have exceeded the reference value ref1, and via its input 55 (FIG. 6) that the current signal continuous to have a positive sign. This state, which is characterized by the state change arrow "$+I_{int2}$ & $a_{max}$" pointing clockwise from the upper state circle in FIG. 8, brings the logic to keep the attained state on the input 76, change over $I_{int2}$ to the input 64 of the switch 58, and to open the output 74 for decharging the capacitance 74 by the changed current flow direction, cf. also "d—" in the 45° circle of FIG. 8. The state defined by the 45°-circle of the state graph has now been attained. The resulting decrease of the amplitude of the 360° signal results in the phase of the signal ($CK_{out}$) mixed by the 360° and 90° signals being continuously changed (along the negative edge of d in FIG. 7) toward 90° which is attained when the capacitance 94 is entirely decharged, if the current $I_{int2}$ does not become zero before that, in which case the phase of $CK_{out}$ stops on a value between 45° and 90°.

The state "$+I_{int2}$ & $d_{min}$" defined in association with the clockwise directed state change arrow between the 45° and 90° state circles has now been attained and is sensed by the logic as implying that the inputs 78, 80 and 82 take the same state. If the sign of $I_{int2}$ furthermore continues to be positive, the logic is now set to open the input 60 of the switch 58 and the output 70 of the selector 66 for $I_{int2}$ with positive sign, that charges the capacitance 90, following the positive edge of curved b in FIG. 7, cf. also "b+" in the 90° circle in FIG. 8.

As long as $I_{int2}$ is different from zero the logic continuous to continously work through the state graph according to FIG. 8 for continuous change of the phase of $CK_{out}$, in the same way as has been described above. The direction is determined by the sign of $I_{int2}$, i.e. it is counter clockwise in the graph at negative $I_{int2}$, following the inner state change arrows.

If $I_{int2}$ is small, i.e. if a small phase error appears, a relatively slow recharge is obtained at the respective output 48–54, whereby a relatively slow phase change is obtained via the controllable impedances 38–44. The result becomes, however, a slow movement around according to FIGS. 7 and 8, and thereby a continous phase change.

A greater current $I_{int2}$ results in a faster recharge of the capacitances at the outputs from the analog selector 66 and thereby a faster phase change.

The magnitude of the capacitancs 88–94 also affects the speed such as at increasing magnitude the process becomes slower.

Figure 9:
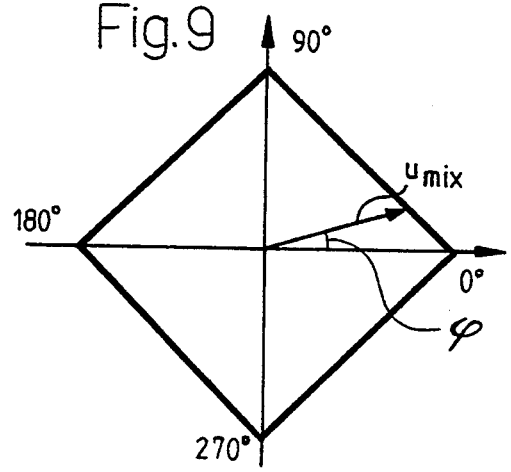
FIG. 9 is a vector diagram illustrating the variation of the amplitude of the recovered clock signal with phase changes, FIG. 10 show signal diagrams of the phase detector according to FIG. 2.
Figure 11:
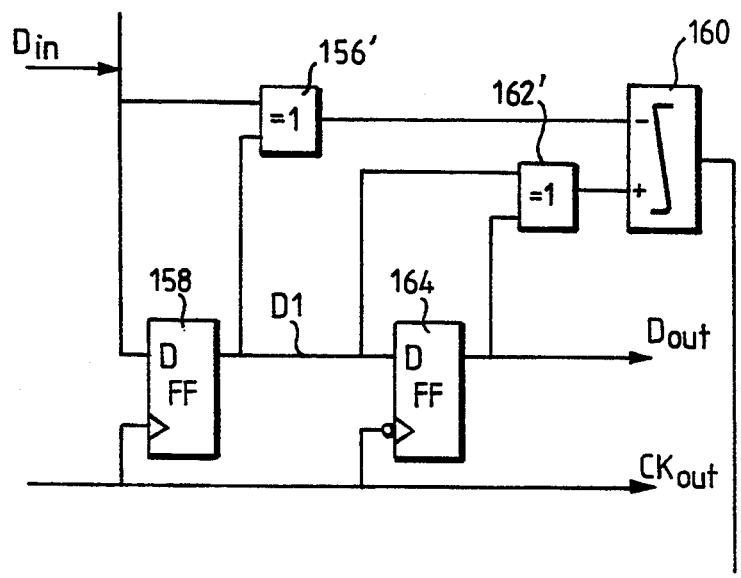
FIG. 11 shows an alternative embodiment of the phase detector according to FIG. 2.
Figures 12A, 12B, 12C:
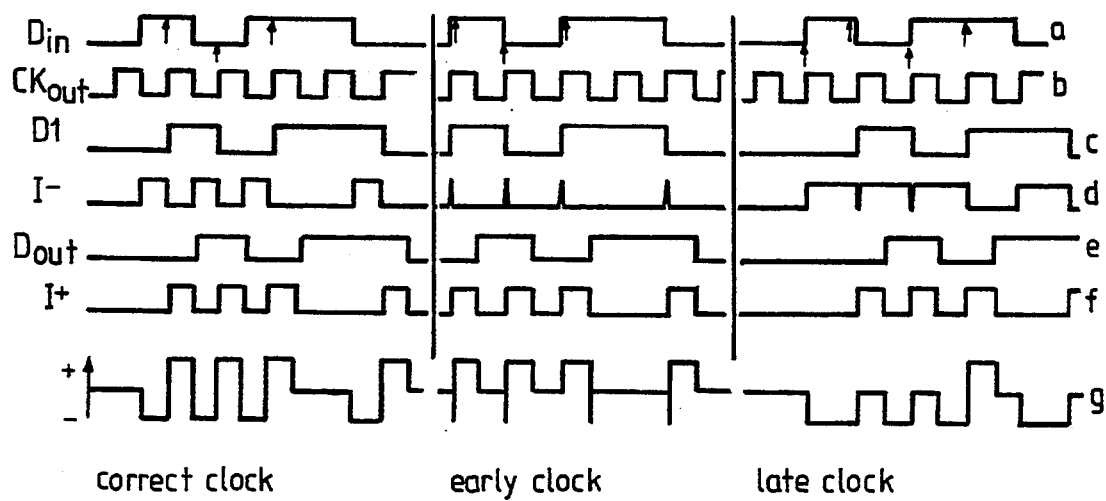
FIG. 12 shows signal diagrams of the phase detector according to FIG. 11.

The above described can also be illustrated by means of the vector diagram according to FIG. 9, where the magnitude of the arrow $u_{mix}$, which represents the signal resulting from the mixing of two signals, i.e. $CK_{out}$, gives the amplitude of this signal for a certain phase shift $p$ between $CK_{out}$ and $CK_{in}$. As can be seen the amplitude has maximum at four occasions, i.e. when the 90°, 180°, 270° and 360° signals, respectively, are let through unmixed alone.

The implementation in practice of the logic control network 56, in order to be able to carry through that described above with reference to the state graph, is easily conceivable by the man of the art and need therefore not be described more closely here. Shortly there can be the question of a sequence circuit of a conventional implementation per se, e.g. built from i.a. MOS-transistors.

For each one of the inputs 60 and 64, and the outputs 68, 70, 72, 74, respectively, the switches 58 and 66 can be equipped with suitably connected transmission gates including MOS-transistors digitally controlled from the control network 56. The inputs 84 and 86 represented in FIG. 4 as each a single input, would then in practice correspond to two and four control inputs, respectively. Also here the man of the art understands how to carry this through in practice.

Two embodiments of the design and the function of the phase detector circuit 2 will now be described more closely below with reference to FIGS. 2 and 10, and 11 and 12, respectively.

In the embodiment according to FIG. 2 the input 4 of the phase detector circuit 2 is connected on the one hand to an input of an AND gate 156, on the other hand to the D-input of a MS-flipflop 158, i.e. an edge trigged D-flipflop. The clock input of the MS-flipflop 158 is connected to the input 18 for the recovered clock signal $CK_{out}$ and its output to an inverting input of the AND-gate 156, the output of which is connected to the negative input of an integrator 160. The output of the MS-flipflop 158 is furthermore connected on the one hand to an input of a further AND-gate 162, on the other hand to the D-input of a further MS-flipflop 164. The clock input of the MS-flipflop 164, which is inverting, is likewise connected to the input 18 for the recovered clock signal $CK_{out}$, and its output to an inverting input of an AND-gate 162, the output of which is connected to the positive input of the integrator 160. The output of the MS-flipflop 164 is also connected to the output 6 of the phase detector 2 for providing the data signal $D_{out}$ after clock recovery. The output of the integrator 160 is connected to the control input 20 for the selector circuit 46.

In FIGS. 10a–g there are shown for three different cases, which follow upon each other in the horizontal direction, diagrams over the incoming data signal $D_{in}$, the recovered clock signal $CK_{out}$, the output signal D1 from the MS-flipflop 158, the input signal I+ on the plus input of the integrator 160, the output data signal $D_{ut}$, the input signal I— on the minus input of the integrator, and the signal composed of I+ and I—, which by integration gives rise to the output current $I_{int2}$ from the integrator 160. More particularly, the three cases are, while referring to the recovered clock signal $CK_{out}$, a correct clock, an early clock, and a late clock, respectively.

The input data signal $D_{in}$ appears on the input of the AND-gate 156, and is clocked into the flipflop 158 by $CK_{out}$. When correct clock appears the clocking in is carried through "into the middle of the data eye" with the positive clock edge. The data signal D1 thereby becomes shifted half a clock period, is inverted in the inverting input of the AND-gate 156, and forms together with $D_{in}$ on the other input thereof the signal + on the output of the AND-gate. The positive edge of the pulses of the signal I+ will thereby coincide with positive edges of $D_{in}$.

Due to the inversion of $CK_{out}$ on the clock input of the MS-flipflop 164 clocking in of D1 in this flipflop will be carried through in a way similar to that of $D_{in}$ in the flipflop 158. $D_{out}$ will thereby be shifted half a clock period with respect to D1, i.e. $D_{out}$ and $D_{in}$ will be situated in the same way with respect to the positive edges of $CK_{out}$. $D_{out}$ is inverted in the inverting input of AND-gate 162 and forms together with D1 on the other input thereof the signal I— on the output of the AND-gate. The positive edge of the pulses of the signal I—, which in this case are of the same length as those of the signal I+, will thereby coincide with the negative edge of I+, which results in the current $I_{int2}$ becomming zero.

In the two other cases, i.e. early clock and late clock, respectively, $D_{in}$ is clocked in too early and too late, respectively, into the flipflop 158 by $CK_{out}$. This gives rise to the length change of the pulses of the corresponding signals I+, which appears from FIG. 10d, whereas the pulses I— are maintained unchanged. The respective signals composed of I+ and I— therefore obtain the appearances shown in FIG. 10g. The result becomes that the current signal $I_{int2}$ integrated thereby will be negative at an early clock, and positive at a late clock.

As should have appeared from the above only the positive edges of $D_{in}$ are detected in the embodiment of the phase detector 2 shown in FIG. 2. Setting of the clock can be made more optimal if both positive and negative edges are detected. This can be carried through in a simple way by the alternative embodiment of the phase detector shown in FIG. 11. More particularly, the AND-gates of the earlier embodiment have there been replaced by exclusive-OR gates 156' and 162', respectively. The corresponding curve shapes for the same three cases as according to FIGS. 10a–g are shown in FIGS. 12a–g.

Figure 13:
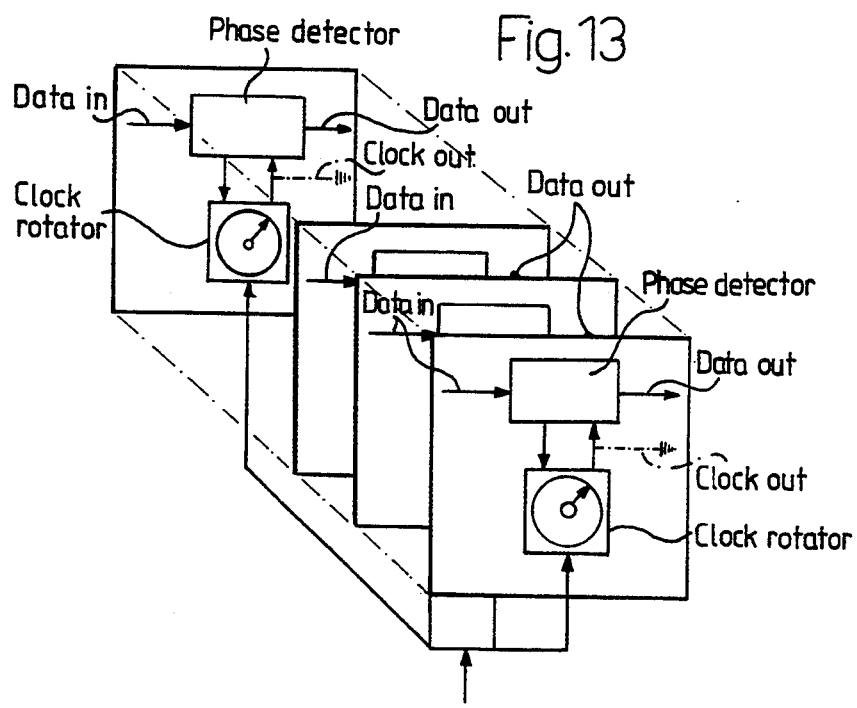
FIG. 13 is a schematic perspective view illustrating use of clock recovery systems according to FIG. 1 for clock recovery in the case of several data flows.

The reference clock signal $CK_{in}$ can be common to a number of clock recovery circuits according to FIG. 1, receiving each its own data flow, as is schematcially illustrated in FIG. 13. Each of the output data flows will then have its own recovered clock $CK_{out}$, but these clocks do not have any common phase position. The latter can in many cases be desirable, e.g. if the data flows are to be multiplexed together. A circuit to carry this through for each data flow is shown in FIG. 14.

Figure 14:
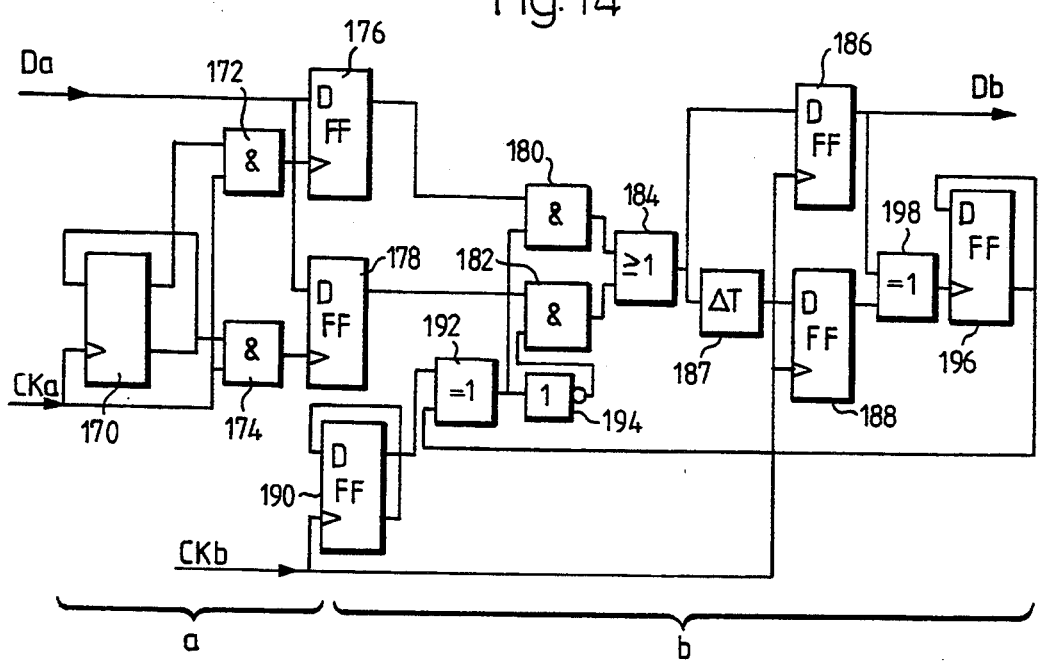
FIG. 14 shows a schematic diagram of a circuit for imparting common phase position to several clock recovered data flows according to FIG. 13.

The circuit according to FIG. 14 is implemented as a FIFO consisting of two portions, viz. one portion for reading the data signal $D_{out}$ and its clock $CK_{out}$ from the clock recovery circuit, and one portion b for reading out the data signal the phase of which has been set to the common phase position. In FIG. 14 the input data signal corresponding to $D_{out}$ is designated Da and its clock with CKa, which thus corresponds to $CK_{out}$. The common clock, to which the respective phases are to be set is designated CKb, and the output data signal with Db. Ckb can be the same as $CK_{out}$ from one of the clock recovery circuits, or a separate clock.

The portion a includes a first MS-flipflop 170 connected as a frequency halver by feed back of the inverting output to the D-input. On its clock input it receives CKa. The flipflop mutually inverted output signals having half the frequency of CKa are fed to one input of a respective AND-gate 172 and 174, of which the other respective input receives CKa. This results in every second clock pulse appearing alternatively on each one of the outputs of the two AND-gates 172 and 174, said outputs being connected to the clock input of a respective MS-flipflop 176 and 178. The D inputs of the MS flipflops 176 and 178 are connected for reception of Da. This results in every second data bit being clocked into each a corresponding one of these MS flipflops.

Reading out in the portion b is carried through in a corresponding way. The outputs of the MS flipflops 176 and 178 via an input of a respective AND-gate 180 and 182, are connected to each an input of an OR-gate 184. The output of the OR-gate 184 is connected, on the one hand to the D input of a MS flipflop 186 and, on the other hand, via a delay element 187 to the D input of a MS flipflop 188. The clock inputs of the MS flipflops 186 and 188 receive the clock signal CKb, which controls the reading out from every second of the flipflops 176 and 178 to the flipflops 186 and 188 in a way which will appear from the following.

More particularly, CKb is also fed to the clock input of a further flipflop 190 which in the same way as the flipflop 170 is connected as a frequency halver and has its non-inverting output connected to one input of an exclusive-OR gate 192, the output of which is connected to the respective second inputs of the AND-gates 180 and 182, in the latter case via an inverter 194. To the other input of the gate 192 the inverting output of a further MS flipflop 196 is connected, which is likewise connected as a frequency halver and the clock input of which via an exclusive-OR gate 198 is connected for receiving the signals on the outputs of the MS flipflops 196 and 198.

The reading out to the MS flipflop 188 is carried through via the delay element 187 so that this flipflop receives somewhat delayed data. If the two flipflops 186 and 188 clock different data the reading is carried through on an edge and in this position the MS flipflop 186 is reclocked. This results in the reading being moved an entire clock cycle. This in turn results in resistibility against phase variations between the input and output of at least one clock cycle minus the delay of the element 187. Db is fed out from the output of the MS flipflop 186.

The FIFO-circuit according to FIG. 14 is as short as possible, viz. only for two bits. This is a minimum for being able to deal with a phase shift of at least one clock period between the portions a and b without losing data. The FIFO can, of course, be made longer if there is a requirement to being able to deal with greater phase shifts without losing information.

In the above described embodiments the number of auxiliary clock signals has furthermore been indicated to be four. Per se, this can be regarded being an optimal number, but neither here there are any limitations. More generally, the said number can thus be stated to be at least three.

The mixing portion of block or clock rotator 16 in FIGS. 1 and 4 can be replaced by some other suitable form of mixing step, e.g. one of a bipolar type, i.e. a differential step with current drain, replacing each one of the switching elements 38–44.

One example of such a circuit is shown schematically in FIG. 15. The controllable switching means 38–44 in FIG. 2 are here replaced by a number of differentially connected pairs 200, 202, 204, 206 of first and second controlled switches, here in the form of transistors.

Said pairs are located between voltage source means indicated by VEE, and a common differential output having first and second terminals 208 and 210 for forming the common output for the signal with the desired phase, i.e. $CK_{out}$. The first and second controlled switches 200.1, 200.2; 202.1, 202.2; 204.1, 204.2; and 206.1, 206.2; respectively, of each pair have their respective outputs connected to said first and second terminals 208, 210, respectively.

The differentially connected pairs 200–206 are furthermore connected, in a way to be described more closely below, to said voltage source means VEE via current path means containing current source means and control means connected to the control outputs 48–54 for controlling the current flow to the differentially connected pairs 200–206.

More particularly said current path means comprise a respective current path for each of said differentially connected pairs and said current source means comprise a respective controllable current source 212, 214, 216–218 in each current path. Said control means comprise respective control inputs of said controllable current sources 212–218 connected to the control outputs 48–54.

Also in a way to be described more in detail below, the transistors of the differentially connected pairs have their control inputs, i.e. base electrodes, connected for receiving the auxiliary clock signals.

More particularly, the differentially connected pairs are in turn connected in pairs for receiving two of the auxiliary clock signals as shown in FIG. 15. With reference to e.g. the two pairs 200 and 204, it can be seen that the 0° auxiliary clock signal is received on the base electrode of the first transistor 200.1 of the differentially connected pair 200 and on the base electrode of the second transistor 204.2 of the differentially connected pair 204. The 180° auxiliary signal is received on the base electrode of the second transistor 200.2 of the pair 200 and on the base electrode of the first transistor 204.1 of the pair 204.

Similarily the differentially connected pairs 202 and 206 form a pair for receiving the 90° and 270° auxiliary signals in the same way.

In FIG. 15 it can be seen that a resistance is indicated in series with each emitter electrode. This resistance is a so called emitter degenerating resistance for obtaining improved linearization of the transistor output signal. The input signal to the phase rotator should be triangular or sinus shaped for obtaining monotonously identical phase steps.

In the vector diagram according to FIG. 16 the magnitude of the arrow $u_{mix}$, in the same way as in FIG. 9, represents the signal resulting from the mixing of two signals, i.e. $CK_{out}$, and gives the amplitude of this signal for a certain phase shift $\rho$ between $CK_{out}$ and $CK_{in}$. As can be seen the amplitude has maximum at four occasions, i.e. for 45°, 135°, 225° and 315° phase shift.

The circuit according to FIG. 15 can be said to provide active mixing with separate controllable current sources, in contrast to the circuit with controllable resistances 38–44 in FIG. 2, which provides a passive resistive mixing.

FIG. 17 is a further example of a circuit providing active mixing, but with a common fixed current source. The circuit according to FIG. 17 differs from that of FIG. 15 only by the realization of its current paths connecting its differentially connected pairs 200–206 of transistors with the potential level VEE.

More particularly said current paths comprise a respective first current path 220, 222, 224 and 226 for each of the differentially connected pairs and a second current path 228 common to all differentially connected pairs. A common fixed current source 230 is located in said second current path, and each of said first current paths includes a controllable current source 232, 234, 236 and 238, respectively, with respective control inputs for connection to e.g. the control outputs 48–54.

In the vector diagram according to FIG. 18 the magnitude of the arrow $u_{mix}$, in the same way as in FIG. 16, represents the signal resulting from the mixing of two signals, i.e. $CK_{out}$, and gives the amplitude of this signal for a certain phase shift $\rho$ between $CK_{out}$ and $CK_{in}$. As can be seen the amplitude is here constant.

In a further embodiment each of e.g. two differentially connected pairs, such as those of FIGS. 15 and 17, may be connected for receiving the two auxiliary clock signals alternately on its first and second control inputs. The way of operation of the circuits according to FIGS. 15 and 17 is the same as that described above with reference to FIGS. 7 and 8.

Figure 19:
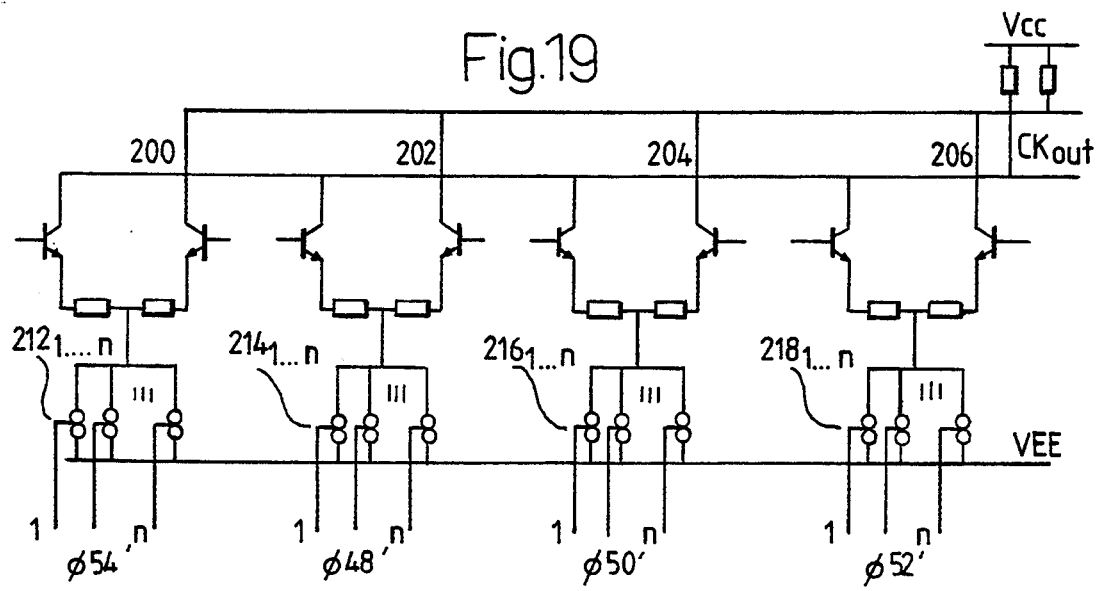
FIG. 19 illustrates a phase variation circuit similar to the one of FIG. 15 but differing therefrom by being digitally controlled.

FIG. 19 schematically illustrates a digital clock rotator solution having similarities to the circuit of FIG. 15. For easy reference similar reference numerals as in FIG. 15 are used in FIG. 19 for indicating the same or similar details.

As in FIG. 15 the circuit includes four differentially connected pairs 200–206 of first and second control switches connected, in the same way as in FIG. 15, between a common differential output 210, 208 and a common voltage source means indicated by VEE.

The controllable current sources 212–218 of FIG. 15 have, however, been replaced by each a number of n digitally controlled current sources $112_1 \ldots n-218_1 \ldots n$. Most simply there can be only one digital current source for each differential step, which results in a possible resolution of 45°. As the number of simultaneously controlled current sources increases it will be possible to obtain a digital approximation of the sinus and cosinus functions for obtaining an adjustment with a smooth step resolution and a relatively smooth output amplitude. The obtainable resolution and step size is determined by the number of current sources and their individual weighting, as well as by a control logic circuit illustrated in FIG. 20.

This control logic circuit has as many outputs as the number of digitally controlled current sources, i.e. a number of n for each of the differential steps 200–206. For easy reference the four sets of outputs of the control logic circuit and the four sets of control inputs to the digitally controlled current sources have each been marked 48', 50', 52' and 54', respectively, to underline the similarity to the circuit of FIG. 15.

The logic of the logic circuit is controlled by a ring counter 250, to be described more in detail below, which indicates the phase position to be taken by the clock rotator. The number of phase positions is determined by the desired degree of resolution.

The phase detector can be the same as in FIG. 2 where the sign of the current $I_{int2}$ determines whether the clock is early or late with respect to the phase position of the data signal. The phase detector can also be a more simple type which only states whether the timing is late or early.

Figure 20:
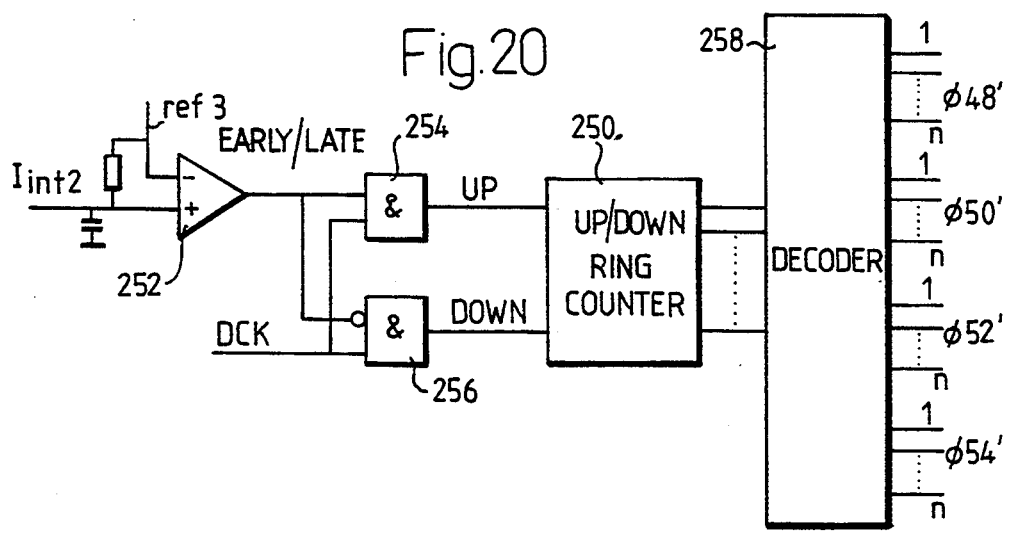
FIGS. 20 and 21 show two embodiments of control logic circuits for controlling the circuit of FIG. 19.

FIG. 20 illustrates how the signal $I_{int2}$ of the phase detector is digitized. $I_{int2}$ is received on the +input of a comparator 252, the −input of which receives the reference value ref3, c.f. FIG. 6 and the description above referring thereto. The output signal of the comparator 252 is received on an input of a first AND-gate 254 and on an inverting input of a second AND-gate 256. The respective other inputs of the gates 254 and 256 receive an adjustment or discriminator clock signal DCK, which is thereby gated by the comparator output signal. A high or low output signal from the comparator indicates if $CK_{in}$ is early or late, respectively. The outputs from the gates 254 and 256 are received by the counter 250. The outputs of the counter 250 are received by a decoder 258 having the outputs 48'-54'.

For early clocking $I_{int2}$ is positive, meaning that the comparator provides a high output signal. This in turn results in up counting pulses to the counter 250 with a frequency determined by DCK. The up pulses cause forward counting of the ring counter. This results in the digital phase rotator increasing the phase until the output signal $I_{int2}$ of the phase detector changes sign. When this happens the comparator 252 will give a low output signal resulting in the counter 250 receiving down pulses counting down the counter until the phase detector again provides a positive output signal, followed by up pulses, etc. In this way the phase rotator will work to and fro around the desired value. The phase variation or phase jitter amplitude obtained is determined by the resolution or step size of the clock rotator.

The speed of the adjustment of the clock phase is determined by the speed of DCK and the length of the ring counter 250. The number of positions for each turn of the decoder and clock rotator determines the resolution.

The ring counter 250 is an up/down ring counter having no limitation with respect to the counting sequence up or down. It works cyclically and when all steps have been passed it counts further for a new turn. The ring counter running a turn means that also the clock rotator runs a turn. The number of steps of the counter 250 is the same as, or more than the number of states which can be taken by the decoder 258. If there are more steps in the counter 250 there is required a number of up or down pulses in sequence for instructing the decoder 250 and the phase rotating circuit to take a new phase position.

In this manner the output signal of the phase detector is integrated or filtered. By this error readings, if any, of the phase detector are suppressed, which can occur due to jitter in the input signal of the phase rotator.

The frequency of DCK determines how often the up or down pulses can appear, and limits the maximum speed of rotation of the phase rotator, this providing a stabilizing influence on the logic in the control loop. DCK can be external or internally divided down from $CK_{in}$, which results in a good control of the different regulation parameters.

It is also conceivable to use a simplified type of phase rotator with only two differential steps, which principally performs the control within only one quadrant at a time (as opposed to the cases illustrated by FIGS. 9, 16 and 18). Change of quadrant is possible to obtain by inverting the input clock signal for change-over to the next quadrant. This change-over should be carried through when the next differential step is still turned off. Thereby a smooth and continous change-over between the quadrants is obtained.

By such an embodiment it is possible to save logic in the decoder since it need only control two sets of current sources (instead of four) plus two clock inverters (for 0° and 90°, respectively).

Figure 21:
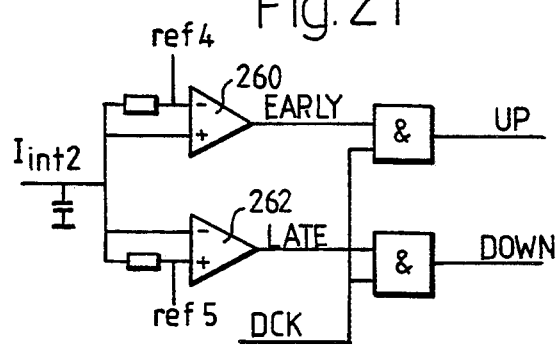

FIG. 21 illustrates a modification by means of which also the magnitude of a phase position can be measured. In this embodiment $I_{int2}$ is received on the +input of a first comparator 260 and on the −input of a second comparator 262. On their other inputs the comparators 260 and 262 receive a respective reference signal ref4 and ref5. The outputs of the comparators 260 and 262 are respectively received by an input of the AND-gate 254 and an input of the AND-gate 256.

If $I_{int2}$ is small, resulting in neither up pulses, nor down pulses, the clock rotator is made to take a stop state in case of a small phase error. In this way a more quiet control is obtained although at the cost of a certain backlash.

Although in the embodiment according to FIG. 19 the differential stages are shown and described as comprising each a single differentially connected pair of control switches and a number of digitally controlled current sources, it would also be conceivable to let each differential step comprise several pairs of control switches in parallel, e.g. one for each digitally controlled current source.

It would also be conceivable to use a combination of digital and analog control where the digital control is used for coarse control and the analog one for fine control.

The invention is furthermore not limited to clock recovery for a digital data signal, but in its most general form teaches a method for generally shifting the phase of a clock signal. This can be conceived if it is imagined that details 2-6 and 20 are removed from FIGS. 1 and 2, and instead a control signal with variable amplitude and sign is directly fed to the input 20 of the phase varying circuit 16 from e.g. a variable current source. It is also possible to influence the control logic directly. In the digital case in FIG. 20 it is possible to supply counting pulses directly to the counter 250, or control the decoder directly, i.e. supplying state code directly thereto.

As has appeared from the above it should once again be emphasized that the invention suggests a method for generally shifting or rotating the phase of a clock signal continuously an arbitrary number of turns forwards or backwards without interruptions or discontinuities in the recovered clock signal.

I claim:

1. A system for shifting the phase of a clock signal, comprising: first means for receiving said clock signal and providing a number of auxiliary clock signals phase shifted with respect to said clock signal and to each other, second means for choosing two of the auxiliary clock signals between the phases of which a desired new phase of said clock signal is situated, and third means for mixing the two chosen auxiliary clock signals with each other until a signal with said desired phase is obtained, including:
   a number of controllable switching means having auxiliary clock signal inputs for receiving said auxiliary clock signals, and a common output on which said signal with the desired phase is obtained,
   a control signal generator for providing a control signal with a variable amplitude and sign, and
   a selector circuit having a control input for receiving said control signal, control outputs for controlling the switching means to let through their respective auxiliary clock signals, and activating means for monitoring the amplitude and sign of said control signal and selectively activating a number of the control outputs;
   wherein said activating means include an analog control network and an analog selector, which both are connected for receiving the control signal, the control network controlling the selector for entirely opening, via one of the chosen control outputs, a corresponding switching means for letting through the corresponding auxiliary signal without amplitude decrease, and for connecting, via another chosen control output, the control signal with correct sign to a corresponding switching means for letting through the corresponding auxiliary clock signal with an amplitude decrease determined by the amplitude of the control signal.

2. A system according to claim 1, wherein inverting means for inverting the control signal, an analog switch having a first input for receiving the control signal, a second input for receiving the inverted value of the control signal from said inverting means, and an output connected to the input of said analog selector, said control network controlling the choice of either of said first and second inputs of said analog switch for determination of the sign of an output signal appearing on said output thereof.

3. A system according to claim 1 wherein said controllable switching means comprise a number of differentially connected pairs of first and second controlled switches,
said pairs being located between voltage source means and a common differential output having first and second terminals for forming said common output for said signal with the desired phase, said first and second controlled switches of each pair having respective outputs connected to said first and second terminals, respectively,
said pairs being further connected to said voltage source means via current path means containing current source means and control means connected to said control outputs for controlling the current flow to said pairs,
said controlled switches having control inputs connected for receiving said auxiliary clock signals.

4. A system according to claim 2 wherein said controllable switching means comprise a number of differentially connected pairs of first and second controlled switches,
said pairs being located between voltage source means and a common differential output having first and second terminals for forming said common output for said signal with the desired phase, said first and second controlled switches of each pair having respective outputs connected to said first and second terminals, respectively,
said pairs being further connected to said voltage source means via current path means containing current source means and control means connected to said control outputs for controlling the current flow to said pairs,
said controlled switches having control inputs connected for receiving said auxiliary clock signals.

5. A system according to claim 3, wherein said differentially connected pairs are in turn connected in pairs for receiving one of said auxiliary clock signals on the control input of the first controlled switch of one of the two differentially connected pairs forming such a last mentioned pair, and on the control input of the second controlled switch of the other differentially connected pair, and another one of said auxiliary clock signals on the control input of the second controlled switch of said one pair, and on the control input of the first controlled switch of said other pair.

6. A system according to claim 4, wherein said differentially connected pairs are in turn connected in pairs for receiving one of said auxiliary clock signals on the control input of the first controlled switch of one of the two differentially connected pairs forming such a last mentioned pair, and on the control input of the second controlled switch of the other differentially connected pair, and another one of said auxiliary clock signals on the control input of the second controlled switch of said one pair, and on the control input of the first controlled switch of said other pair.

7. A system according to claim 3, wherein each of said differentially connected pairs is connected for receiving the two auxiliary clock signals of a respective pair of said auxiliary clock signals alternately on its first and second control inputs.

8. A system according to claim 4, wherein each of said differentially connected pairs is connected for receiving the two auxiliary clock signals of a respective pair of said auxiliary clock signals alternately on its first and second control inputs.

9. A system according to claim 3 wherein said current path means comprise a respective current path for each of said differentially connected pairs, said current source means comprise a respective controllable current source in each current path, and said control means comprise respective control inputs of said controllable current sources.

10. A system according to claim 4 wherein said current path means comprise a respective current path for each of said differentially connected pairs, said current source means comprise a respective controllable current source in each current path, and said control means comprise respective control inputs of said controllable current sources.

11. A system according to claim 3 wherein said current path means comprise a respective first current path for each of said differentially connected pairs and a second current path common to all differentially connected pairs between said first current paths and said voltage source means, said current source means comprise a common current source in said second current path, and said control means comprise a respective controllable switching means with a respective control input in each of said first current paths.

12. A system according to claim 4 wherein said current path means comprise a respective first current path for each of said differentially connected pairs and a second current path common to all differentially connected pairs between said first current paths and said voltage source means, said current source means comprise a common current source in said second current path, and said control means comprise a respective controllable switching means with a respective control input in each of said first current paths.

13. A system for shifting the phase of a clock signal, comprising: first means for receiving said clock signal and providing a number of auxiliary clock signals phase shifted with respect to said clock signal and to each other, second means for choosing two of the auxiliary clock signals between the phases of which a desired new phase of said clock signal is situated, and third means for mixing the two chosen auxiliary clock signals with each other until a signal with said desired phase is obtained, including:
a number of controllable switching means having auxiliary clock signal inputs for receiving said auxiliary clock signals, and a common output on which said signal with the desired phase is obtained, a control signal generator for providing a control signal with a variable amplitude and sign, and a selector circuit having a control input for receiving said control signal, control outputs for controlling the switching means to let through their respective auxiliary clock signals, and activating means for monitoring the amplitude and sign of said control signal and selectively activating a number of the control outputs;

wherein said controllable switching means comprise a number of differentially connected pairs of first and second controlled switches, said pairs being located between voltage source means and a common differential output having first and second terminals for forming said common output for said signal with the desired phase, said first and second controlled switches of each pair having respective outputs connected to said first and second terminals, respectively, said pairs being further connected to said voltage source means via current path means containing current source means and control means connected to said control outputs for controlling the current flow to said pairs, said controlled switches having control inputs connected for receiving said auxiliary clock signals.

14. A system according to claim 13, wherein said differentially connected pairs are in turn connected in pairs for receiving one of said auxiliary clock signals on the control input of the first controlled switch of one of the two differentially connected pairs forming such a last mentioned pair, and on the control input of the second controlled switch of the other differentially connected pair, and another one of said auxiliary clock signals on the control input of the second controlled switch of said one pair, and on the control input of the first controlled switch of said other pair.

15. A system according to claim 13, wherein each of said differentially connected pairs is connected for receiving the two auxiliary clock signals of a respective pair of said auxiliary clock signals alternately on its first and second control inputs.

16. A system according to claim 13, wherein said current path means comprise a respective current path for each of said differentially connected pairs, said current source means comprise a respective controllable current source in each current path, and said control means comprise respective control inputs of said controllable current sources.

17. A system according to claim 13, wherein said current path means comprise a respective first current path for each of said differentially connected pairs and a second current path common to all differentially connected pairs between said first current paths and said voltage source means, said current source means comprise a common current source in said second current path, and said control means comprise a respective controllable switching means with a respective control input in each of said first current paths.

18. A system for shifting the phase of a clock signal, comprising: first means for receiving said clock signal and providing a number of auxiliary clock signals phase shifted with respect to said clock signal and to each other, second means for choosing two of the auxiliary clock signals between the phases of which a desired new phase of said clock signal is situated, and third means for mixing the two chosen auxiliary clock signals with each other until a signal with said desired phase is obtained, including:

a number of controllable switching means having auxiliary clock signal inputs for receiving said auxiliary clock signals, and a common output on which said signal with the desired phase is obtained, a control signal generator for providing a control signal with a variable amplitude and sign, and a selector circuit having a control input for receiving said control signal, control outputs for controlling the switching means to let through their respective auxiliary clock signals, and activating means for monitoring the amplitude and sign of said control signal and selectively activating a number of the control outputs;

wherein said controllable switching means comprise a number of sets of at least one differentially connected pair each of first and second controlled switches, said pairs being located between voltage source means and a common differential output having first and second terminals for forming said common output for said signal with the desired phase, said first and second controlled switches of each pair having respective outputs connected to said first and second terminals, respectively, said sets of pairs being further connected to said voltage source means via a number of digitally controllable current sources having control inputs connected to logic circuitry having as an input said control signal with a variable amplitude and sign, and said controlled switches having control inputs connected for receiving said auxiliary clock signals.

19. A system according to claim 18, wherein said differentially connected pairs are in turn connected in pairs for receiving, one of said auxiliary clock signals on the control input of the first controlled switch of one of the two differentially connected pairs forming such a last mentioned pair, and on the control input of the second controlled switch of the other differentially connected pair, and another one of said auxiliary clock signals on the control input of the second controlled switch of said one pair, and on the control input of the first controlled switch of said other pair.

20. A system according to claim 18, characterized in that each of said differentially connected pairs is connected for receiving the two auxiliary clock signals of a respective pair of said auxiliary clock signals alternately on its first and second control inputs.

21. A system according to claim 18, wherein each set comprises a single differentially connected pair of first and second controlled switches connected via at least two of said digitally controllable current sources in parallel to said voltage source means.

22. A system according to claim 18, wherein each set comprises more than one of said differentially connected pairs of first and second controlled switches.

23. A system according to claim 19 wherein each set comprises a single differentially connected pair of first and second controlled switches connected via at least two of said digitally controllable current sources in parallel to said voltage source means.

24. A system according to claim 20 wherein each set comprises a single differentially connected pair of first and second controlled switches connected via at least two of said digitally controllable current sources in parallel to said voltage source means.

25. A system according to claim 19 wherein each set comprises more than one of said differentially connected pairs of first and second controlled switches.

26. A system according to claim 20 wherein each set comprises more than one of said differentially connected pairs of first and second controlled switches.

27. A system for clock recovery of a digital data signal, comprising:
   a phase detector for receiving the data signal and transmitting the same after clock recovery,
   a phase correcting device for creating and emitting, by means of a number of mutually phase shifted auxiliary signals derived from an incoming clock signal, a recovered clock signal for the data signal, said recovered clock signal being fed to the phase detector for detecting a phase position error, if any, between the data signal and its recovered clock signal and transmitting information with respect to this to the phase correcting device, the phase correction device including; a phase variation circuit for mixing, if the phase position error is different from zero and the phase position of the recovered clock signal is situated between the phase position for two auxiliary clock signals, these two auxiliary clock signals being mixed with each other for forming an adjusted recovered clock signal having the same phase position as the data signal;
   wherein the phase variation circuit includes;
   a number of controllable switching means for receiving on auxiliary clock signal inputs said auxiliary clock signals and connected to a common output, on which the recovered clock signal with the shifted phase is obtained, and
   a selector circuit with control outputs connected for controlling the switch means to let through their respective auxiliary clock signals, and with activating means for monitoring the magnitude and sign of the control signal and selectively activating a number of the control outputs;
   wherein the detector circuit creates and transmits the phase position information in the form of an analog signal, the amplitude of which is a measure of the magnitude of the phase error, and the sign of which indicates the direction of the phase error, and
   the activating means include an analog control network and an analog selector, which both are connected for receiving the analog signal, the control network controlling the selector to entirely open, via one of the two chosen control outputs, the corresponding switching means for letting through the auxiliary clock signal thereof without amplitude decrease, and to connect, via the other chosen control output, the analog signal with the correct sign to the corresponding switching means for letting through the auxiliary clock signal thereof with an amplitude decrease determined by the amplitude of the control signal.

28. A system according to claim 27, which further includes inverting means for inverting the control signal, an analog switch having a first input for receiving the control signal, a second input for receiving the inverted value of the control signal from said inverting means, and an output connected to the input of said analog selector, said control network controlling the choice of either of said first and second inputs of said analog switch for determination of the sign of an output signal appearing on said output thereof.

29. A system according to claim 27 wherein said controllable switching means comprise a number of differentially connected pairs of first and second controlled switches,
   said pairs being located between voltage source means and a common differential output having first and second terminals for forming said common output for said signal with the desired phase, said first and second controlled switches of each pair having respective outputs connected to said first and second terminals, respectively,
   said pairs being further connected to said voltage source means via current path means containing current source means and control means connected to said control outputs for controlling the current flow to said pairs,
   said controlled switches having control inputs connected for receiving said auxiliary clock signals.

30. A system according to claim 28 wherein said controllable switching means comprise a number of differentially connected pairs of first and second controlled switches,
   said pairs being located between voltage source means and a common differential output having first and second terminals for forming said common output for said signal with the desired phase, said first and second controlled switches of each pair having respective outputs connected to said first and second terminals, respectively,
   said pairs being further connected to said voltage source means via current path means containing current source means and control means connected to said control outputs for controlling the current flow to said pairs,
   said controlled switches having control inputs connected for receiving said auxiliary clock signals.

31. A system according to claim 29, wherein said differentially connected pairs are in turn connected in pairs for receiving,
   one of said auxiliary clock signals on the control input of the first controlled switch of one of the two differentially connected pairs forming such a last mentioned pair and on the control input of the second controlled switch of the other differentially connected pair, and
   another one of said auxiliary clock signals on the control input of the second controlled switch of said one pair, and on the control input of the first controlled switch of said other pair.

32. A system according to claim 30, wherein said differentially connected pairs are in turn connected in pairs for receiving,
   one of said auxiliary clock signals on the control input of the first controlled switch of one of the two differentially connected pairs forming such a last mentioned pair and on the control input of the second controlled switch of the other differentially connected pair, and
   another one of said auxiliary clock signals on the control input of the second controlled switch of said one pair, and on the control input of the first controlled switch of said other pair.

33. A system for clock recovery of a digital data signal, comprising:
   a phase detector for receiving the data signal and transmitting the same after clock recovery, a phase correcting device for creating and emitting, by means of a number of mutually phase shifted auxiliary signals derived from an incoming clock signal, a recovered clock signal for the data signal, said recovered clock signal being fed to the phase detector for detecting a phase position error, if any, between the data signal and its recovered clock signal and transmitting information with respect to this to the phase correcting device, the phase correction device including; a phase variation circuit for mixing, if the phase position error is different from zero and the phase position of the recovered clock signal is situated between the phase position for two auxiliary clock signals, these two auxiliary clock signals being mixed with each other for forming an adjusted recovered clock signal having the same phase position as the data signal;

wherein said controllable switching means comprise a number of differentially connected pairs of first and second controlled switches, said pairs being located between voltage source means and a common differential output having first and second terminals for forming said common output for said signal with the desired phase, said first and second controlled switches of each pair having respective outputs connected to said first and second terminals, respectively, said pairs being further connected to said voltage source means via current path means containing current source means and control means connected to said control outputs for controlling the current flow to said pairs, said controlled switches having control inputs connected for receiving said auxiliary clock signals.

34. A system according to claim 33, wherein said differentially connected pairs are in turn connected in pairs for receiving, one of said auxiliary clock signals on the control input of the first controlled switch of one of the two differentially connected pairs forming such a last mentioned pair, and on the control input of the second controlled switch of the other differentially connected pair, and another one of said auxiliary clock signals on the control input of the second controlled switch of said one pair, and on the control input of the first controlled switch of said other pair.

35. A system according to claim 33, characterized in that each of said differentially connected pairs is connected for receiving the two auxiliary clock signals of a respective pair of said auxiliary clock signals alternately on its first and second control inputs.

36. A system according to claim 33, wherein said current path means comprise a respective current path for each of said differentially connected pairs, said current source means comprise a respective controllable current source in each current path, and said control means comprise respective control inputs of said controllable current sources.

37. A system according to claim 33, wherein said current path means comprise a respective first current path for each of said differentially connected pairs and a second current path common to all differentially connected pairs between said first current paths and said voltage source means, said current source means comprise a common current source in said second current path, and said control means comprise a respective controllable switching means with a respective control input in each of said first current paths.

38. A system for clock recovery of a digital data signal, comprising:

a phase detector for receiving the data signal and transmitting the same after clock recovery, a phase correcting device for creating and emitting, by means of a number of mutually phase shifted auxiliary signals derived from an incoming clock signal a recovered clock signal for the data signal, said recovered clock signal being fed to the phase detector for detecting a phase position error, if any, between the data signal and its recovered clock signal and transmitting information with respect to this to the phase correcting device, the phase correction device including; a phase variation circuit for mixing, if the phase position error is different from zero and the phase position of the recovered clock signal is situated between the phase position for two auxiliary clock signals, these two auxiliary clock signals being mixed with each other for forming an adjusted recovered clock signal having the same phase position as the data signal;

wherein the phase variation circuit includes;

a number of controllable switching means for receiving on auxiliary clock signal inputs said auxiliary clock signals and connected to a common output, on which the recovered clock signal with the shifted phase is obtained, and a selector circuit with control outputs connected for controlling the switch means to let through their respective auxiliary clock signals, and with activating means for monitoring the magnitude and sign of the control signal and selectively activating a number of the control outputs;

wherein said controllable switching means comprise a number of sets of at least one differentially connected pair each of first and second controlled switches, said pairs being located between voltage source means and a common differential output having first and second terminals for forming said common output for said signal with the desired phase, said first and second controlled switches of each pair having respective outputs connected to said first and second terminals, respectively, said sets of pairs being further connected to said voltage source means via a number of digitally controllable current sources having control inputs connected to logic circuitry having as an input said control signal with a variable amplitude and sign, and said controlled switches having control inputs connected for receiving said auxiliary clock signals.

39. A system according to claim 38, wherein said differentially connected pairs are in turn connected in pairs for receiving, one of said auxiliary clock signals on the control input of the first controlled switch of one of the two differentially connected pairs forming such a last mentioned pair, and on the control input of the second controlled switch of the other differentially connected pair, and another one of said auxiliary clock signals on the control input of the second controlled switch of said one pair, and on the control input of the first controlled switch of said other pair.

40. A system according to claim 38, characterized in that each of said differentially connected pairs is connected for receiving the two auxiliary clock signals of a respective pair of said auxiliary clock signals alternately on its first and second control inputs.

41. A system according to claim 38, wherein each set comprises a single differentially connected pair of first and second controlled switches connected via at least two of said digitally controllable current sources in parallel to said voltage source means.

42. A system according to claim 38, wherein each set comprises more than one of said differentially connected pairs of first and second controlled switches.

43. A system according to claim 39 wherein each set comprises a single differentially connected pair of first and second controlled switches connected via at least two of said digitally controllable current sources in parallel to said voltage source means.

44. A system according to claim 40 wherein each set comprises a single differentially connected pair of first and second controlled switches connected via at least two of said digitally controllable current sources in parallel to said voltage source means.

45. A system according to claim 39 wherein each set comprises more than one of said differentially connected pairs of first and second controlled switches.

46. A system according to claim 40 wherein each set comprises more than one of said differentially connected pairs of first and second controlled switches.

47. A system according to claim 41 wherein each set comprises more than one of said differentially connected pairs of first and second controlled switches.

48. A system for shifting the phase of a clock signal, comprising:
  first means for receiving said clock signal and providing a number of auxiliary clock signals phase shifted with respect to said clock signal and to each other,
  second means for choosing two of the auxiliary clock signals between the phases of which a desired new phase of said clock signal is situated, and
  third means for mixing the two chosen auxiliary clock signals with each other until a signal with said desired phase is obtained, including
  a number of controllable switching means having auxiliary clock signal inputs for receiving said auxiliary clock signals, and a common output on which said signal with the desired phase is obtained,
  means for providing control signals to said switching means;
  wherein said controllable switching means comprise a number of differentially connected pairs of first and second controlled switches,
  said pairs being located between voltage source means and a common differential output having first and second terminals for forming said common output for said signal with the desired phase, said first and second controlled switches of each pair having respective outputs connected to said first and second terminals, respectively,
  said pairs being further connected to said voltage source means via current path means containing current source means and control means connected to said control outputs for controlling the current flow to said pairs,
  said controlled switches having control inputs connected for receiving said auxiliary clock signals.

49. A system according to claim 48, wherein said differentially connected pairs are in turn connected in pairs for receiving,
  one of said auxiliary clock signals on the control input of the first controlled switch of one of the two differentially connected pairs forming such a last mentioned pair, and on the control input of the second controlled switch of the other differentially connected pair, and
  another one of said auxiliary clock signals on the control input of the second controlled switch of said one pair, and on the control input of the first controlled switch of said other pair.

50. A system according to claim 48, characterized in that each of said differentially connected pairs is connected for receiving the two auxiliary clock signals of a respective pair of said auxiliary clock signals alternately on its first and second control inputs.

51. A system according to claim 48, wherein said current path means comprise a respective current path for each of said differentially connected pairs, said current source means comprise a respective controllable current source in each current path, and said control means comprise respective control inputs of said controllable current sources.

52. A system according to claim 48, wherein said current path means comprise a respective first current path for each of said differentially connected pairs and a second current path common to all differentially connected pairs between said first current paths and said voltage source means, said current source means comprise a common current source in said second current path, and said control means comprise a respective controllable switching means with a respective control input in each of said first current paths.

53. A system for shifting the phase of a clock signal, comprising:
  first means for receiving said clock signal and providing a number of auxiliary clock signals phase shifted with respect to said clock signal and to each other,
  second means for choosing two of the auxiliary clock signals between the phases of which a desired new phase of said clock signal is situated, and
  third means for mixing the two chosen auxiliary clock signals with each other until a signal with said desired phase is obtained, including
  a number of controllable switching means having auxiliary clock signal inputs for receiving said auxiliary clock signals, and a common output on which said signal with the desired phase is obtained,
  means for providing control signals to said switching means;
  wherein said controllable switching means comprise a number of sets of at least one differentially connected pair each of first and second controlled switches,
  said pairs being located between voltage source means and a common differential output having first and second terminals for forming said common output for said signal with the desired phase, said first and second controlled switches of each pair having respective outputs connected to said first and second terminals, respectively,
  said sets of pairs being further connected to said voltage source means via a number of digitally controllable current sources having control inputs connected to logic circuitry, and said controlled switches having control inputs connected for receiving said auxiliary clock signals.

54. A system according to claim 53, wherein said differentially connected pairs are in turn connected in pairs for receiving,
one of said auxiliary clock signals on the control input of the first controlled switch of one of the two differentially connected pairs forming such a last mentioned pair, and on the control input of the second controlled switch of the other differentially connected pair, and
another one of said auxiliary clock signals on the control input of the second controlled switch of said one pair, and on the control input of the first controlled switch of said other pair.

55. A system according to claim 53, characterized in that each of said differentially connected pairs is connected for receiving the two auxiliary clock signals of a respective pair of said auxiliary clock signals alternately on its first and second control inputs.

56. A system according to claim 53, wherein each set comprises a single differentially connected pair of first and second controlled switches connected via at least two of said digitally controllable current sources in parallel to said voltage source means.

57. A system according to claim 53, characterized in that each set comprises more than one of said differentially connected pairs of first and second controlled switches.

58. A system for clock recovery of a digital data signal, comprising:
a phase detector for receiving the data signal and transmitting the same after clock recovery,
a phase correcting device for creating and emitting, by means of a number of mutually phase shifted auxiliary signals derived from an incoming clock signal a recovered clock signal for the data signal, said recovered clock signal being fed to the phase detector for detecting a phase position error, if any, between the data signal and its recovered clock signal and transmitting information with respect to this to the phase correcting device, the phase correction device including; a phase variation circuit for mixing, if the phase position error is different from zero and the phase position of the recovered clock signal is situated between the phase position for two auxiliary clock signals, these two auxiliary clock signals being mixed with each other for forming an adjusted recovered clock signal having the same phase position as the data signal;
wherein the phase variation circuit includes;
a number of controllable switching means for receiving on auxiliary clock signal inputs said auxiliary clock signals and connected to a common output, on which the recovered clock signal with the shifted phase is obtained, and
a selector circuit with control outputs connected for controlling the switch means to let through their respective auxiliary clock signals, and with activating means for monitoring the magnitude and sign of the control signal and selectively activating a number of the control outputs;
wherein said controllable switching means comprise a number of differentially connected pairs of first and second controlled switches,
said pairs being located between voltage source means and a common differential output having first and second terminals for forming said common output for said signal with the desired phase, said first and second controlled switches of each pair having respective outputs connected to said first and second terminals, respectively,
said pairs being further connected to said voltage source means via current path means containing current source means and control means connected to said control outputs for controlling the current flow to said pairs,
said controlled switches having control inputs connected for receiving said auxiliary clock signals.

59. A system according to claim 58, wherein said differentially connected pairs are in turn connected in pairs for receiving,
one of said auxiliary clock signals on the control input of the first controlled switch of one of the two differentially connected pairs forming such a last mentioned pair and on the control input of the second controlled switch of the other differentially connected pair, and
another one of said auxiliary clock signals on the control input of the second controlled switch of said one pair, and on the control input of the first controlled switch of said other pair.

* * * * *